(12) United States Patent
Cordeiro

(10) Patent No.: US 8,339,286 B2
(45) Date of Patent: Dec. 25, 2012

(54) BASELINE UPDATE PROCEDURE FOR TOUCH SENSITIVE DEVICE

(75) Inventor: Craig A. Cordeiro, Westford, MA (US)

(73) Assignee: 3M Innovative Properties Company, Saint Paul, MN (US)

( * ) Notice: Subject to any disclaimer, the term of this patent is extended or adjusted under 35 U.S.C. 154(b) by 428 days.

(21) Appl. No.: 12/750,924

(22) Filed: Mar. 31, 2010

(65) Prior Publication Data

US 2011/0241907 A1    Oct. 6, 2011

(51) Int. Cl.
*H03M 11/00* (2006.01)
(52) U.S. Cl. .......................................... 341/20; 345/172
(58) Field of Classification Search .................. 345/172, 345/178; 341/20, 33
See application file for complete search history.

(56) References Cited

U.S. PATENT DOCUMENTS

| | | | |
|---|---|---|---|
| 5,572,205 A | 11/1996 | Caldwell et al. | |
| 5,730,165 A | 3/1998 | Philipp | |
| 6,452,514 B1 | 9/2002 | Philipp | |
| 6,504,530 B1 | 1/2003 | Wilson et al. | |
| 6,730,863 B1 | 5/2004 | Gerpheide et al. | |
| 6,977,646 B1 * | 12/2005 | Hauck et al. ................. | 345/173 |
| 7,400,318 B2 | 7/2008 | Gerpheide et al. | |
| 8,004,503 B2 * | 8/2011 | Zotov et al. ................. | 345/178 |
| 8,026,904 B2 * | 9/2011 | Westerman ................. | 345/173 |
| 8,130,212 B2 * | 3/2012 | Umeda ......................... | 345/178 |
| 2004/0188151 A1 | 9/2004 | Gerpheide et al. | |
| 2006/0267953 A1 | 11/2006 | Peterson, Jr. et al. | |
| 2006/0293864 A1 | 12/2006 | Soss | |
| 2008/0007529 A1 | 1/2008 | Paun et al. | |
| 2008/0136792 A1 | 6/2008 | Peng et al. | |
| 2008/0158145 A1 | 7/2008 | Westerman | |
| 2008/0158146 A1 | 7/2008 | Westerman | |
| 2008/0158147 A1 | 7/2008 | Westerman et al. | |
| 2009/0114456 A1 | 5/2009 | Wisniewski | |
| 2009/0135157 A1 | 5/2009 | Harley | |
| 2009/0255737 A1 | 10/2009 | Chang et al. | |
| 2010/0007631 A1 | 1/2010 | Chang | |

OTHER PUBLICATIONS

International Search Report, Form PCT/ISA/210, International Application No. PCT/US2011/030313, International Filing Date: Mar. 29, 2011, 2 pages.
Kremin, Victor and Bachtinskiy, Rusian; "Capacitance Sensing—Waterproof Capacitance Sensing", Cypress Perform—AN2398, Document No. 001-14501, Rev. *A, Dec. 8, 2006, pp. 1-11.
Lee, Mark; "Build a Touch-Sensor Solution for Wet Environments", Design Solution, Ed OnLine 19873, Electronic Design go to www.electroniodesion,com. Oct. 23, 2008, pp. 51-57.
Perme, Tom; Software Handling for Capacitive Sensing:, Microchip, AN1103, 2007 Microchip Technology Inc. pp. 1-16.
Pratt, Susan; Analog Devices AN-829 "Environmental Compensation on the AD7142: The Effects of Temperature and Humidity on Capacitance Sensors", Analog Devices www.analog.com, Dec. 2005, pp, 1-8.
Touch Sensors Design Guide; Atmel®, 10620E-AT42—Sep. 2009.
U.S. Appl. No. 61/231,471, "High Speed Multi-Touch Touch Device and Controller Therefor", filed Aug. 5, 1009.

* cited by examiner

*Primary Examiner* — Brian Young
(74) *Attorney, Agent, or Firm* — Steven A. Bern

(57) ABSTRACT

A touch sensitive device implementing a routine that controls the device's baseline update procedure in certain circumstances, and associated methods.

11 Claims, 3 Drawing Sheets

BASELINE UPDATE PROCEDURE FOR TOUCH SENSITIVE DEVICE

BACKGROUND

Some mutual capacitive-type touch sensitive devices having matrix-type sensors are continuously calibrated to accommodate changes in ambient operating conditions. For example, as a mutual capacitive, matrix-type touch sensor heats up, an individual node on the sensor may become more or less sensitive to touch events. To accommodate these changes in sensitivity, a controller coupled to the touch sensor gradually adjusts a baseline value associated with particular nodes. The theoretical ideal baseline is the portion of a touch signal that is common to both the touch and a non-touch event. Of course, the non-touch portion of the signal is not known during a touch event, so it must be estimated. This estimation may be accomplished by, for example, determining the moving average value associated with a node during non-touch events. Other, more complicated methods are also known in the art.

Certain events may cause baseline calibrations leading to anomalous behavior. For example, if water or some other conductive liquid is sprayed onto a touch screen, a continuous calibration routine may adjust to this condition, such that when the water is removed a touch event is erroneously reported.

Such an anomalous condition may be seen in FIG. 1, which is a time plot of exemplary data representative of that which might come from a node on a multi-touch, mutual capacitance matrix-type touch device. The Y-axis in FIG. 1 represents counts, but the value of the Y-axis could be any value representative of voltage, time, current or any other attribute that is chosen as a surrogate for the level of capacitance at a given node. The X-axis refers to the sample number, which represents a sample taken repeatedly, for example every 5 milliseconds (ms), by controller electronics. Raw count 301, then, is the count data value, sampled every 5 ms, associated with a particular node. Baseline 330 generally follows the trend of the plot of raw data 301. Baseline 330 is a function of raw count 301, and could be anything from a moving average to the output of a filter such as an infinite impulse response (IIR) filter. After an initial calibration after touch device startup, baseline 330 is slowly adjusted over time to compensate for changes in the operating environment, such as temperature.

On the same graph, effective count 302 is a plot of:

(raw count value 301)–(baseline 330).

Threshold 305 is the touch threshold, which in this example is around 300 counts. When effective count 301 exceeds threshold 305, a touch is reported by an associated controller. For example, touch event 310 is shown impacting raw count value 301, which corresponds to touch event 310A on effective count 302. Note that in this embodiment, touch event 310 causes the count raw count value 301 to decrease, which is a condition associated with a reduction in the mutual capacitance at the node. The decrease is an artifact of the particular implementation of the electronics and firmware; other implementations could result in increase rather than a decrease in the Y-axis value. For the duration of touch event 310 (and thus touch event 310A), a touch would be reported by controller 114, and the baseline would not be updated.

Water event 320 may result in raw data count 301 going up or down. In FIG. 1, water event 320 is shown as an increasing value in raw data count 301, representing an increase in mutual capacitance at the node. Water event may be associated with a user cleaning the screen, for example. As the movement in raw data count 301 is in the direction opposite touch, the effective count 302 never exceeds threshold value 305, and thus no touch is reported when the water is applied. Also, because the baseline update algorithm is likewise not inhibited due to the recognition of a touch event, the baseline value updates to accept as ambient the condition of water being on the sensor surface. This baseline update is sometimes called in the industry "straying away from touch." If water event 320 had caused an effective decrease in counts, and the baseline were similarly updated, this would be called in the industry "straying toward touch."

Because baseline 330 has been adjusted to accommodate the water as an ambient operating condition, when the user wipes the screen dry, it could immediately cause the effective count value to exceed the threshold, which controller would report as erroneous touch event 312. A touch would then be continuously reported by controller 114, because the baseline would not be updated during the touch event.

If the straying portrayed in FIG. 1 had been "toward touch," a different artifact would arise that is not necessarily as problematic: upon wiping the screen, until the baseline is adjusted in due course, the screen could be less sensitive to touch, which could be accommodated by the user pressing more directly on the touch surface of the sensor.

SUMMARY

It is, then, one object of the embodiments described in this disclosure to provide an improved means for updating the baseline value associated with a given node, such that the baseline effectively resists being updated when certain events may be taking place, such as the cleaning of the touch screen, or water or other conductive liquid coming into contact with an area of the touch screen. In one embodiment, an improved baseline updating procedure could prevent, for example, erroneous touch events from being reported by a controller after a liquid, such as a cleaning liquid, has been abruptly removed from the touch sensitive surface of the touch sensitive device.

In one embodiment, a method of determining to update baseline values associated with nodes on a mutual capacitive type touch sensitive device is described, the method comprising receiving data streams associated with the capacitive coupling at a plurality of nodes on a touch sensor, over a plurality of measurement cycles; determining, based on the data streams, if a sufficient portion of the plurality of nodes have been trending toward or away from touch for a sufficient period of time; based on the determination, updating baseline values associated with at least some of the nodes on the touch sensor.

In another embodiment, a touch sensitive device is described, the device comprising a touch matrix-type touch sensor having a plurality of nodes; electronics communicatively coupled to the nodes and configured to measure the capacitive coupling at individual nodes of the touch sensor; wherein the electronics are configured to receive data streams indicative of the capacitive coupling at a plurality of nodes on the touch sensor; determine, based on the data streams, if a sufficient portion of the plurality of nodes have been trending toward or away from touch for a sufficient period of time; and, based on the determination, updating baseline values associated with at least some of the nodes on the touch sensor.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

The present disclosure may be more completely understood and appreciated in consideration of the following detailed description of various embodiments in connection with the accompanying drawings, in which.

In the following description of the illustrated embodiments, reference is made to the accompanying drawings, in which is shown by way of illustration, various embodiments in which the invention may be practices. It is to be understood that the embodiments may be utilized and structural changes may be made without departing from the scope of the present invention. Drawings and graphs are for illustration of the disclosure and are not to scale, and in some drawings, dimensions are exaggerated for purposes of illustration.

DETAILED DESCRIPTION OF ILLUSTRATIVE EMBODIMENTS

Figure 2:
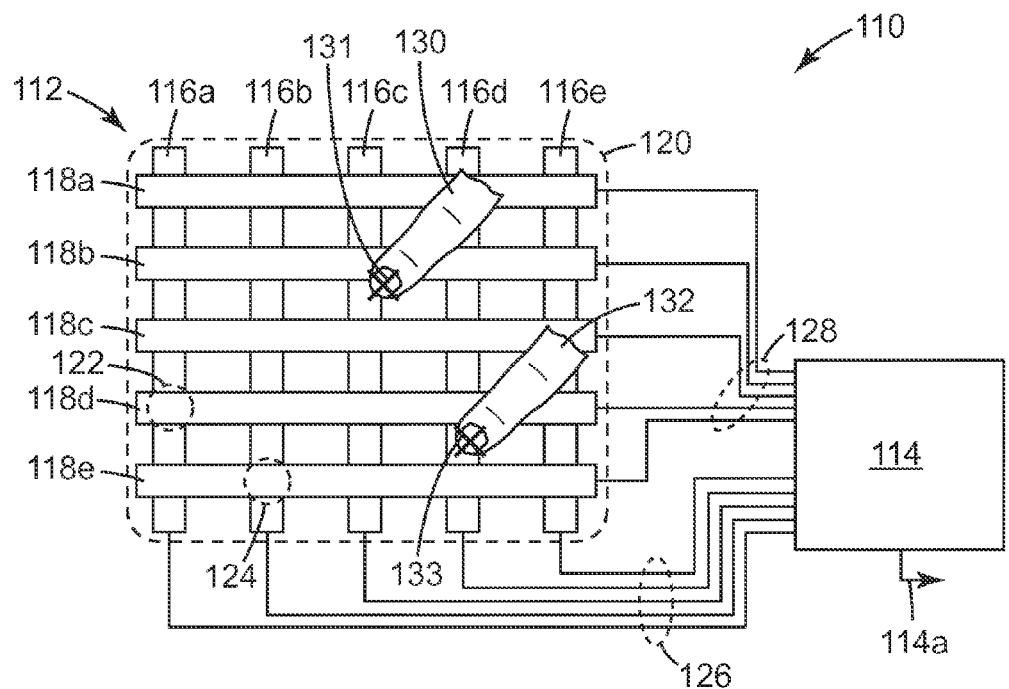
FIG. 2 shows a schematic view of a touch sensitive device and electronics.

In FIG. 2, an exemplary touch device 110 is shown. The device 110 includes a touch panel 112 connected to electronic circuitry, which for simplicity is grouped together into a single schematic box labeled 114 and referred to collectively as a controller.

The touch panel 112 is shown as having a 5×5 matrix of column electrodes 116a-e and row electrodes 118a-e, but other numbers of electrodes and other matrix sizes can also be used. The panel 112 is typically substantially transparent so that the user is able to view an object, such as the pixilated display of a computer, hand-held device, mobile phone, or other peripheral device, through the panel 112. The boundary 120 represents the viewing area of the panel 112 and also preferably the viewing area of such a display, if used. The electrodes 116a-e, 118a-e are spatially distributed, from a plan view perspective, over the viewing area 120. For ease of illustration the electrodes are shown to be wide and obtrusive, but in practice they may be relatively narrow and inconspicuous to the user. Further, they may be designed to have variable widths, e.g., an increased width in the form of a diamond-or other-shaped pad in the vicinity of the nodes of the matrix in order to increase the inter-electrode fringe field and thereby increase the effect of a touch on the electrode-to-electrode capacitive coupling. In exemplary embodiments the electrodes may be composed of indium tin oxide (ITO) or other suitable electrically conductive materials. From a depth perspective, the column electrodes may lie in a different plane than the row electrodes (from the perspective of FIG. 2, the column electrodes 116a-e lie underneath the row electrodes 118a-e) such that no significant ohmic contact is made between column and row electrodes, and so that the only significant electrical coupling between a given column electrode and a given row electrode is capacitive coupling. The matrix of electrodes typically lies beneath a cover glass, plastic film, or the like, so that the electrodes are protected from direct physical contact with a user's finger or other touch-related implement. An exposed surface of such a cover glass, film, or the like may be referred to as a touch surface. Additionally, in display-type applications, a back shield may be placed between the display and the touch panel 112. Such a back shield typically consists of a conductive ITO coating on a glass or film, and can be grounded or driven with a waveform that reduces signal coupling into touch panel 112 from external electrical interference sources. Other approaches to back shielding are known in the art. In general, a back shield reduces noise sensed by touch panel 112, which in some embodiments may provide improved touch sensitivity (e.g., ability to sense a lighter touch) and faster response time. Back shields are sometimes used in conjunction with other noise reduction approaches, including spacing apart touch panel 112 and a display, as noise strength from LCD displays, for example, rapidly decreases over distance. In addition to these techniques, other approaches to dealing with noise problems are discussed in reference to various embodiments, below.

The capacitive coupling between a given row and column electrode is primarily a function of the geometry of the electrodes in the region where the electrodes are closest together. Such regions correspond to the "nodes" of the electrode matrix, some of which are labeled in FIG. 2. For example, capacitive coupling between column electrode 116a and row electrode 118d occurs primarily at node 122, and capacitive coupling between column electrode 116b and row electrode 118e occurs primarily at node 124. The 5×5 matrix of FIG. 2 has 25 such nodes, any one of which can be addressed by controller 114 via appropriate selection of one of the control lines 126, which individually couple the respective column electrodes 116a-e to the controller, and appropriate selection of one of the control lines 128, which individually couple the respective row electrodes 118a-e to the controller.

When a finger 130 of a user or other touch implement comes into contact or near-contact with the touch surface of the device 110, as shown at touch location 131, the finger capacitively couples to the electrode matrix. The finger draws charge from the matrix, particularly from those electrodes lying closest to the touch location, and in doing so it changes the coupling capacitance between the electrodes corresponding to the nearest node(s). For example, the touch at touch location 131 lies nearest the node corresponding to electrodes 116c/118b. This change in coupling capacitance can be detected by controller 114 and interpreted as a touch at or near the 116a/118b node using systems and methods described, for example, in U.S. patent application Ser. No. 61/231,471 "High Speed Multi-touch Touch Device and Controller Therefor", which is hereby incorporated by reference. Other systems and methods for determining changes in coupling capacitance at such nodes are known in the art. Preferably, the controller is configured to rapidly detect the change in capacitance, if any, of all of the nodes of the matrix, and is capable of analyzing the magnitudes of capacitance changes for neighboring nodes so as to accurately determine a touch location lying between nodes by interpolation. Furthermore, the controller 114 in one embodiment is designed to detect multiple distinct touches applied to different portions of the touch device at the same time, or at overlapping times. Thus, for example, if another finger 132 touches the touch surface of the device 110 at touch location 133 simultaneously with the touch of finger 130, or if the respective touches at least temporally overlap, the controller is capable of detecting the positions 131, 133 of both such touches and providing such locations on a touch output 114a. The number of distinct simultaneous or temporally overlapping touches capable of being detected by controller 114 is not necessarily limited to 2, e.g., it may be 3, 4, or more, depending on the size of the electrode matrix and the capacities of controller 114.

The controller 114 employs a variety of circuit modules and components that enable it to rapidly determine the coupling capacitance at some or all of the nodes of the electrode matrix. For example, the controller preferably includes at least one signal generator or drive unit. The drive unit delivers a drive signal to one set of electrodes, referred to as drive electrodes. In the embodiment of FIG. 2, the column electrodes 116a-e may be used as drive electrodes, or the row electrodes 118a-e may be so used. The drive signal is preferably delivered to one drive electrode at a time, e.g., in a scanned sequence from a first to a last drive electrode. As each such electrode is driven, the controller monitors the other set of electrodes, referred to as receive electrodes. The controller 114 may include further circuitry to receive and process signals on the receive electrodes, and convert these signals into a numeric representations of the capacitive coupling at particular nodes. This additional circuitry may include one or more analog-to-digital converters (ADCs) to convert an analog amplitude to a digital format. One or more multiplexers may also be used to avoid unnecessary duplication of circuit elements. Of course, the controller also preferably includes one or more memory devices in which to store various parameters, and a microprocessor to perform the necessary calculations and control functions.

Figure 3:
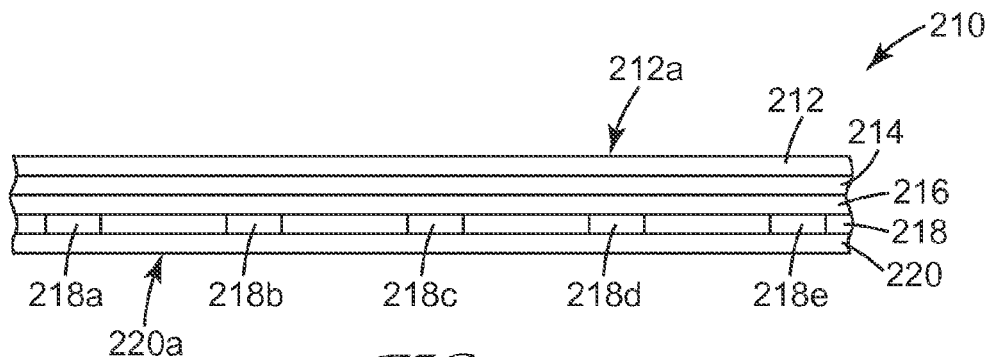
FIG. 3 shows a cross section of a portion of a touch panel used in an exemplary touch sensitive device.

Turning now to FIG. 3, we see there a schematic side view of a portion of a touch panel 210 for use in a touch device. The panel 210 includes a front layer 212, first electrode layer 214 comprising a first set of electrodes, insulating layer 216, second electrode layer 218 comprising a second set of electrodes 218a-e preferably orthogonal to the first set of electrodes, and a rear layer 220. The exposed surface 212a of layer 212, or the exposed surface 220a of layer 220, may be or comprise the touch surface of the touch panel 210.

Figure 1:
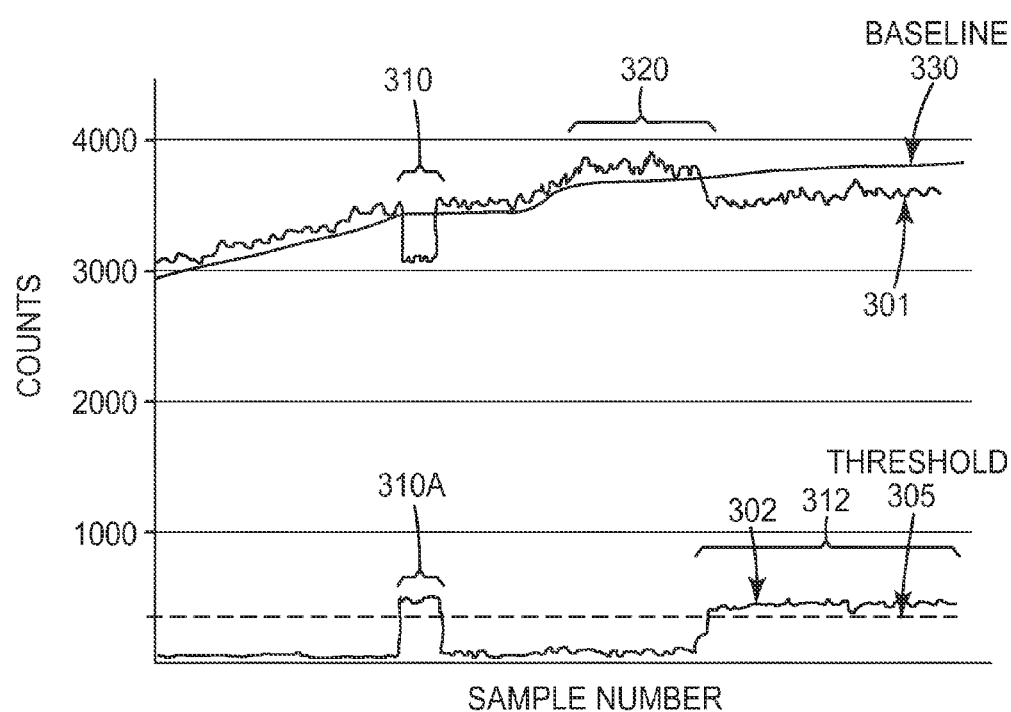
FIG. 1 shows an exemplary data plot associated with an example node on a touch sensitive device.
Figure 4:
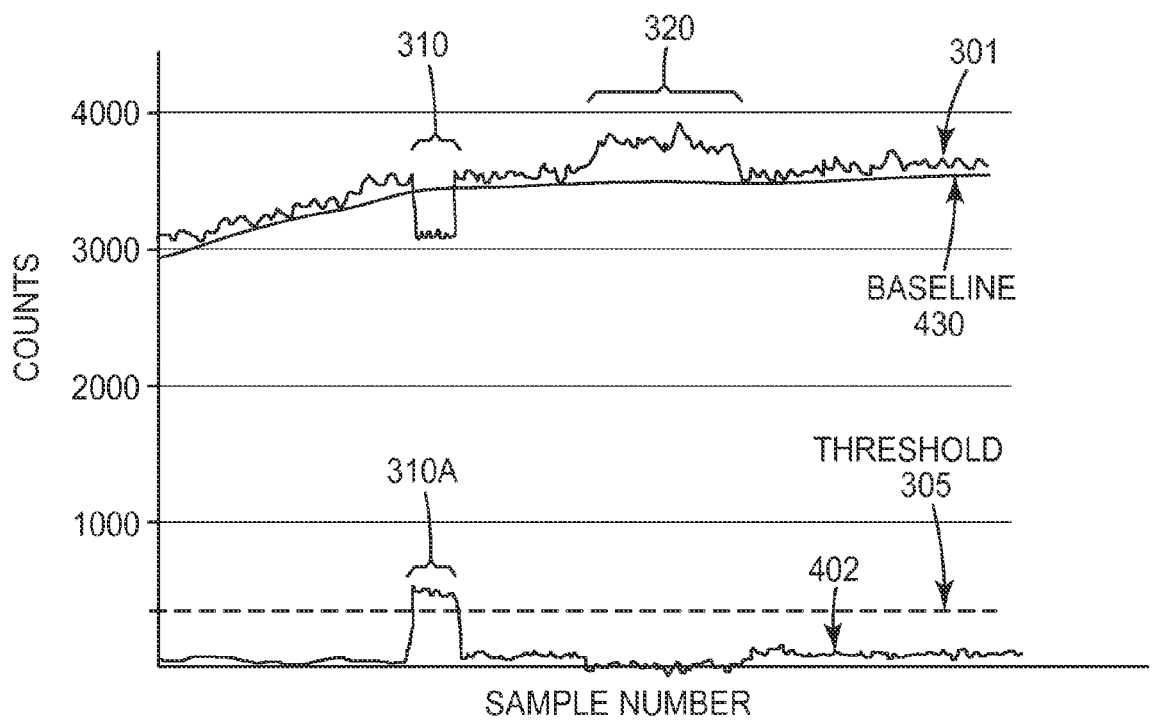
FIG. 4 shows an exemplary data plot associated with an example node on a touch sensitive device; and, FIG. 5 shows a flowchart illustrating a method for selectively updating baseline values associated with nodes.

Turning now to FIG. 4, a time plot similar to that shown in FIG. 1 is shown. It uses the same exemplary raw count value 301 data representative of that which might come from a node on a device such as device 110. However, the embodiment associated with FIG. 4 implements an improved baseline update procedure, discussed below. In FIG. 4, the same touch event 310 is registered as touch event 310a as it exceeds threshold 305. However, in FIG. 4 baseline 430 is not updated in any significant way during or as a result of water event 320. Thus, upon the cessation of water event 320, as for example would occur when a user wipes dry a screen being cleaned, the effective count value 402 never exceeds threshold 305, and thus there is no erroneous touch reported by controller 114.

Figure 5:
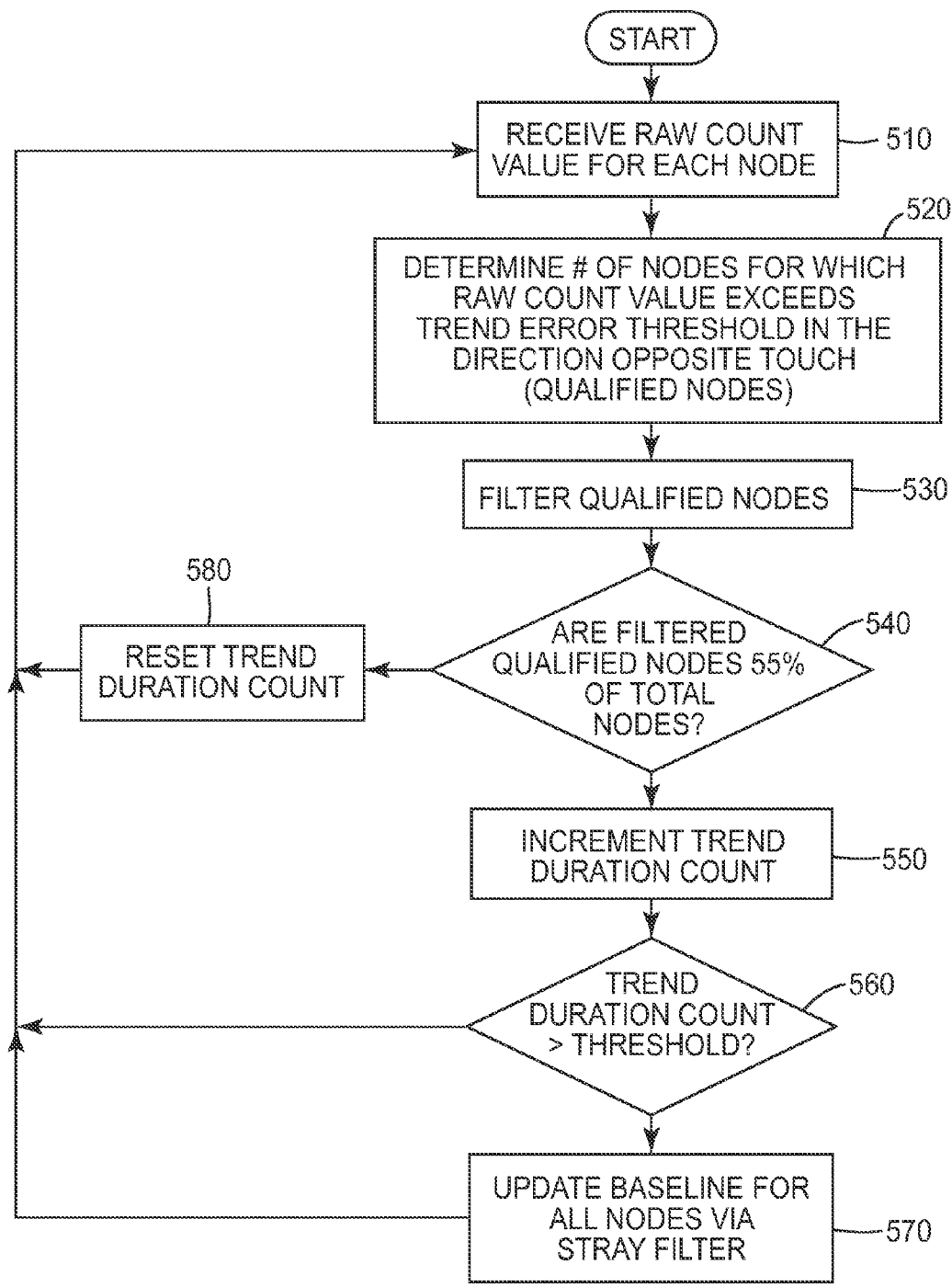

Turning now to FIG. 5, a flowchart is shown describing a baseline updating routine for a touch sensitive device. The baseline update routine would, in some embodiments, prevent erroneous touches associated a sudden change in ambient conditions after a baseline has strayed away from touch, as might occur after a conductive liquid has been wiped from the surface of a capacitive-type touch screen. The same routine could be easily adapted to conditions that stray toward touch, as will be discussed.

Initially, raw count values are received for each node on the touch sensitive device (510). Such raw count values, as mentioned with respect to previous figures, may not be count values at all, depending on implementation, but may instead be some value that is a surrogate for the mutual capacitance at a given node on a touch sensor. For example, the count values may be in fact be voltage levels.

The controller in step 520 determines the number of nodes for which the raw count value exceeds the trend error threshold in the direction away from touch (or toward touch). The trend error threshold is in one embodiment a constant value, and for the sake of illustration is here 4 counts. In practice, the trend error threshold needs to be low, so that the actual baseline and the controller's estimate of the baseline do not diverge excessively, which would lead to touch position error and changes in touch sensitivity. If the touch error threshold is too low, working together with the other factors in the calculation, the routine would more frequently allow the baselines to update to ambient conditions. Thus in step 520, the controller determines the total number of nodes that are 4 counts more than the baseline value for an associated node. For the sake of illustration, let us assume that 2600 nodes are 4 counts less than the baseline value, and 1000 nodes are not less than the baseline value (3600 total nodes on the touch sensitive device).

This number is filtered (step 530). In a typical environment, sample noise could be ten times higher than a reasonable trend error threshold. One or more samples from a typical whole-node data set would almost certainly have, for example, 55% of qualified nodes exceeding the trend threshold in either direction. Therefore the number is suitably filtered (infinite impulse response (IIR) or other low-pass filter) in order to identify an error consistently over the threshold over a period of time. The filter outputs a number, for the sake of illustration let us say it is 2610.

The filtered number (2610) is compared against the total number of nodes (3600). If the filtered number does not exceed 55% of the total nodes ("NO" at decision block 540), a Trend Duration Count variable is reset to zero, and the process repeats for the next measurement cycle. If the filtered number does exceed 55% of the total nodes ("YES" at decision block 540), the Trend Duration Count variable is incremented. The Trend Duration Count threshold is a time-based threshold, since it can only be incremented once per measurement cycle. For example, it might be 5 seconds, divided by a 5 ms measurement cycle, and thus be a value of 5000.

The Trend Duration Count is checked at decision block 560, and if it exceeds a threshold value, the baseline value for all nodes is updated using a stray filter (step 570). In another embodiment, the baseline value for only the nodes qualified nodes identified in step 520 are allowed to update.

In effect, given the interplay of the thresholds via the logic provided in FIG. 5, more than 55% of the screen must be sufficiently trending away from touch for more than 5 seconds in order for the baseline to be updated with a stray update procedure. Conversely, if some number that is less than 55% of nodes are straying away from touch (or toward touch), or the stray has been for less than 5 seconds, there is no baseline update for nodes on the touch screen via the stray filter.

Returning then to FIG. 4, baseline 430 is not updated during water event 320. This could be for one of two reasons, given the logic described in FIG. 5. First, it could be that the water was introduced to an area that was too localized, thus never causing a sufficient trend among 55% or more of nodes in one direction ("NO" at decision block 540). Second, it could be that the water event did cause more than 55% of nodes to stray greater than a threshold value toward touch ("YES" at decision block 540), but such condition lasted for a period of time less than 5 seconds ("NO" at decision block 560). This might be sufficient time, for example, for a user to clean the touch screen with a liquid based cleaner. Note that water's effect on nodes on a touch sensor can be highly variable, in either direction (toward or away from touch).

Effectively, the logic described with respect to FIG. 5 limits the sensitivity of the continuous calibration routine to changes in ambient conditions, by preventing the stray filter to update a baseline value associated with a node unless certain conditions are met. The first condition is one of degree and area (more than 4 counts, registered on over 55% of the nodes), and the second condition is one of time (over 5 seconds). Depending on implementation, a one could adjust the sensitivity by only implementing thresholds related to degree and area, or time.

Note that FIG. 5 deals specifically with straying away from touch (see step 520). The same basic could be concurrently implemented for dealing with straying toward touch, by checking if more than 55% of nodes are straying in sufficient degree either away from touch or toward touch, then applying the same time-based threshold checks of step 550 and beyond.

Although the embodiments described herein have been described with respect to a mutual capacitance-type touch sensitive device, the same concepts would apply to a capacitance to ground-type touch sensitive device. Also, embodiments described herein have been described with respect to a baseline value that is associated each node. A skilled artisan will recognize that the baseline could be associated with groupings of nodes, and this is contemplated within the scope of this disclosure. Further, the skilled artisan will recognize that instead of updating the baseline, node-specific threshold values could be used as a surrogate for the baselines. In such an embodiment, each node's threshold value would be updated based on ambient conditions. The same basic concepts discussed herein apply to such an approach, and are contemplated within the scope of this disclosure.

What I claim is:

1. A method of determining to update baseline values associated with nodes on a mutual capacitive type touch sensitive device, comprising:
    receiving data streams associated with the capacitive coupling at a plurality of nodes on a touch sensor, over a plurality of measurement cycles;
    determining, based on the data streams, if a sufficient portion of the plurality of nodes have been trending toward or away from touch for a sufficient period of time; and
    updating baseline values associated with at least some of the nodes on the touch sensor if a sufficient portion of the plurality of nodes have been trending toward or away from touch for a sufficient period of time.

2. The method of claim 1, wherein the touch sensitive device has a sensor subcomponent that is substantially transparent.

3. The method of claim 1, wherein a sufficient portion comprises at least 55% of the nodes.

4. The method of claim 1, wherein a sufficient period of time is at least one second.

5. The method of claim 1, wherein updating baseline values associated with at least some portion of the nodes comprises all of the nodes.

6. The method of claim 1, wherein the baseline value is a threshold value, the threshold value being indicative of a touch condition.

7. A touch sensitive device comprising:
    a touch matrix-type touch sensor having a plurality of nodes;
    electronics communicatively coupled to the nodes and configured to measure the capacitive coupling at individual nodes of the touch sensor;
    wherein the electronics are configured to:
        receive data streams indicative of the capacitive coupling at a plurality of nodes on the touch sensor
        determine, based on the data streams, if a sufficient portion of the plurality of nodes have been trending toward or away from touch for a sufficient period of time; and,
        update baseline values associated with at least some of the nodes on the touch sensor, when a sufficient portion of the plurality of nodes have been trending toward or away from touch for a sufficient period of time.

8. The touch sensitive device of claim 7, wherein the touch sensor is substantially transparent.

9. The touch sensitive device of claim 7, wherein a sufficient period of time is at least one second.

10. The touch sensitive device of claim 7, wherein a sufficient portion comprises at least 55% of the nodes.

11. The touch sensitive device of claim 7, wherein the baseline value is a threshold value, the threshold value being indicative of a touch condition.

* * * * *

UNITED STATES PATENT AND TRADEMARK OFFICE
CERTIFICATE OF CORRECTION

PATENT NO. : 8,339,286 B2  
APPLICATION NO. : 12/750924  
DATED : December 25, 2012  
INVENTOR(S) : Craig Cordeiro Page 1 of 1

It is certified that error appears in the above-identified patent and that said Letters Patent is hereby corrected as shown below:

<u>Title Page, Item [56], References Cited, OTHER PUBLICATIONS,</u>
Line 4, Delete "Bachtinskiy" and insert -- Bachunskiy -- therefor.
Line 9, Delete "electroniodesion.com" and insert -- electronicdesign.com -- therefor.
Line 17, Delete "Aug. 5, 1009" and insert -- Aug. 5, 2009 -- therefor.

Signed and Sealed this
Twenty-third Day of April, 2013

Teresa Stanek Rea
*Acting Director of the United States Patent and Trademark Office*